United States Patent
Rattay et al.

[11] Patent Number: 6,121,833
[45] Date of Patent: Sep. 19, 2000

[54] HIGH-GAIN AMPLIFIER

[75] Inventors: Bernard Rattay, Mery s/ Oise; Philippe Rampazzo, Ballancourt sur Essonne; Jean-Christophe Guillard, Morainvilliers; Michel Soulard, Montigny les Comeilles, all of France

[73] Assignee: Alcatel, Paris, France

[21] Appl. No.: 09/271,871

[22] Filed: Mar. 18, 1999

[30] Foreign Application Priority Data

Mar. 19, 1998 [FR] France .................................. 98-03355

[51] Int. Cl.⁷ ........................................................ H03F 3/60
[52] U.S. Cl. .............................. 330/53; 330/54; 333/251
[58] Field of Search .................................... 333/251, 247; 330/53, 54, 286

[56] References Cited

U.S. PATENT DOCUMENTS

| | | | |
|---|---|---|---|
| 4,429,286 | 1/1984 | Nichols et al. | 330/286 |
| 4,672,328 | 6/1987 | Adachi et al. | 330/286 |
| 4,713,634 | 12/1987 | Yamamura | 333/245 |
| 5,115,245 | 5/1992 | Wen et al. | 342/175 |
| 5,235,208 | 8/1993 | Katoh | 257/691 |

*Primary Examiner*—Robert Pascal
*Assistant Examiner*—Henry Choe
*Attorney, Agent, or Firm*—Sughrue, Mion, Zinn, Macpeak & Seas, PLLC

[57] ABSTRACT

To implement a high-gain amplifier in a microwave frequency band, it is proposed to interconnect amplification circuits and to cover the housing that contains them with a lid. In the space between the lid and the amplification circuits, inside the housing, waveguides are provided whose cutoff frequency is such that it allows none of the modes that can be present at the frequencies of the working band to propagate. It is shown that, by forming such waveguides in said space, instead of filling it with absorbents, much better radio isolation is obtained between the output and the input to avoid interfering reinjections. As a result, in the same housing, it is possible to achieve amplification of up to 90 dB, whereas, hitherto, the limit of 45 dB per housing could not be exceeded.

8 Claims, 3 Drawing Sheets

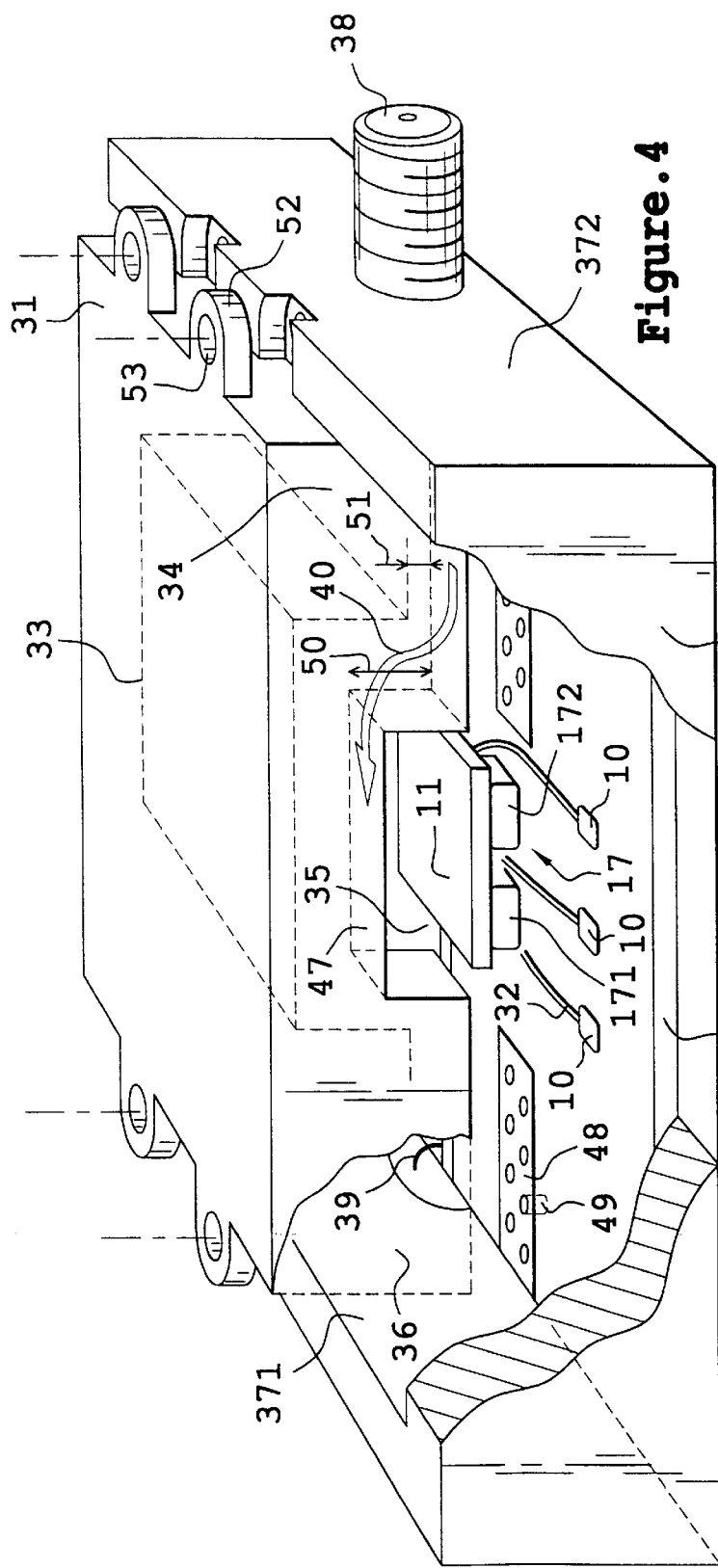
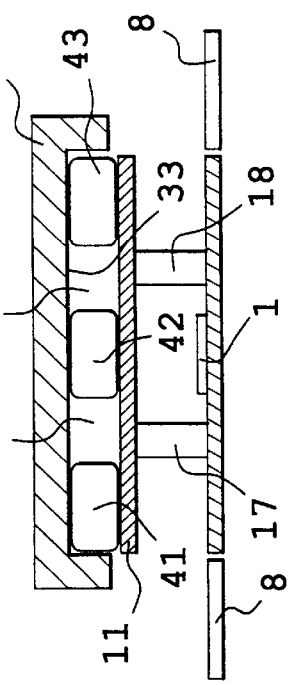
Figure. 4
Figure. 6

HIGH-GAIN AMPLIFIER

FIELD OF THE INVENTION

The present invention relates to a high-gain amplifier that can be used at microwave frequencies. It can be used in particular in radar, in radio beams for satellite transmission, and in local multipoint distribution systems (LMDS) for television. The frequency range concerned by the invention more particularly covers frequencies ranging from 1 GHz to 100 GHz. However, uses may be considered outside these technical fields and outside this frequency range. The invention is applicable whenever radio propagation is considered.

An object of the invention is to propose an amplifier that is high-gain and low-cost. The term "high-gain" is used to mean amplification greater than 40 dB and up to as high as 100 dB.

BACKGROUND OF THE INVENTION

The circuits used to perform the amplification functions include components based on monolithic microwave integrated circuits (MMICs). Such MMIC components include integrated circuits connected together via transmission lines. The architecture, the lengths, and the layout of the transmission lines inside such an MMIC component are of types such as to constitute a microwave amplification circuit that is intrinsically non-oscillatory. In practice, a microwave amplification assembly includes an insulating plate (e.g. made of ceramic, of polytetrafluoroethylene-glass, or of epoxy resin) in which recesses are machined for receiving the MMIC components. The insulating plate carries conductive tracks for interconnecting the components. Each of the MMIC components has an input via which a signal to be amplified is injected, and an output via which the amplified signal is delivered. AN MMIC component is often in the shape of a rectangular block, the input being situated on one side of the MMIC component, and the output being situated on a side opposite from the input side.

The amplified signal radiates naturally in the space situated in the vicinity of the output of the component. Unfortunately, the radiation then propagates to the input. As a result, the signals produced at the output tend to be re-injected into the input. This phenomenon is a radio transmission phenomenon.

To limit the disturbing effect of such phenomena, MMIC components are provided with metal covers and with surrounding absorbent materials. Thus, absorbent materials are placed between the integrated circuits of the MMIC component and the cover. In addition, the MMIC component provided with its cover is itself placed in a housing having an input facing the input of the MMIC component and an output facing the output of the MMIC component. The space between a lid of the housing and the cover is also filled with absorbent materials so as to prevent recursive propagation of amplified waves. The housing is connected to other circuits via shielded link cables.

A drawback suffered by such absorbents is that they do not perform their function satisfactorily. Even if care is taken in choosing the absorbents and their layout, the amplification limits that can be reached with such an amplification circuit, in its housing, are about 40 dB. Beyond such limits, and for certain spectrum components of the frequency band, the MMIC component starts oscillating (the gain is very large), or the re-injection gives rise to considerable attenuation. In the working band, the gain actually achieved varies unpredictably well above or well below the amplification value assigned to it. Such amplifiers are therefore unusable; they produce too much distortion of the amplified signal.

To remedy that problem, e.g. to achieve amplification of 90 dB, provision is made to cascade a plurality of housings, e.g. three housings, containing respective amplification circuits. Naturally, that increases the price substantially threefold.

In addition, the absorbent materials suffer from the drawback of degassing. By sublimation, they diffuse particles which, in particular, penetrate into the conduction channels of the gallium arsenide (GaAs) transistors used in the integrated circuits. In addition, between the cover and the lid, the damping power of the absorbent materials is, in practice, limited to 50 dB at best.

OBJECTS AND SUMMARY OF THE INVENTION

An object of the invention is to remedy that problem by proposing a solution that makes it possible to design amplifiers having high gain, e.g. commonly 60 dB or even 80 dB or 90 dB, without suffering from the phenomenon of interfering reinjection. Under such conditions, it is possible to constitute a high-gain amplifier in a common housing: the cost of the assembly can be considered to be divided substantially by three.

The principle of the invention consists in providing waveguides, referred to respectively as "auxiliary" waveguides and as "additional" waveguides in the spaces situated at the cover of the MMIC circuit, respectively above and below said cover. The cutoff frequencies of the auxiliary waveguides and of the additional waveguides are chosen to be greater than the upper limit of the working passband to be amplified. As a result, all of the signals produced in the working band have frequencies lower than the cutoff frequencies of the waveguides: they cannot propagate therein. Therefore, the feedback from the output of the amplification circuit to its input is reduced to an amount that is small enough not to disturb them. It is then possible to design amplification circuits having very high gain. In practice, the invention has been tested with gains ranging from 80 dB to 90 dB.

An advantage of the invention is to enable waveguides to be constructed that are filled with materials not necessarily having very good absorption characteristics but offering the advantage of not degassing and therefore of not polluting the transistors of the MMIC components.

The invention thus provides a high-gain amplifier for amplifying electrical signals distributed in a high-frequency band, the amplifier including an amplification circuit, the amplification circuit being mounted on a support, e.g. a metal baseplate inside an MMIC component, and being covered with a cover, and the amplification circuit having a signal input on a first side, and a signal output on a second side opposite from said first side, said amplifier including subdivision means for subdividing into auxiliary waveguides the space situated between the cover and the support, the characteristics of the resulting waveguides being unsuitable for enabling a signal whose frequency is situated in the high-frequency band of the amplifier to propagate between the output and the input. Preferably, the space situated above the cover is subdivided in the same way, with additional waveguides having the same characteristics as the auxiliary waveguides.

BRIEF DESCRIPTION OF THE DRAWINGS

The invention is better understood on reading the following description and on examining the accompanying figures. The figures are given merely by way of indication and in no way limit the invention. In the figures:

FIGS. 4 and 5 are perspective views of a housing with its lid, provided with an amplifier MMIC component of the invention; and FIG. 6 is a variant of FIG. 5.

MORE DETAILED DESCRIPTION

Figure 1:
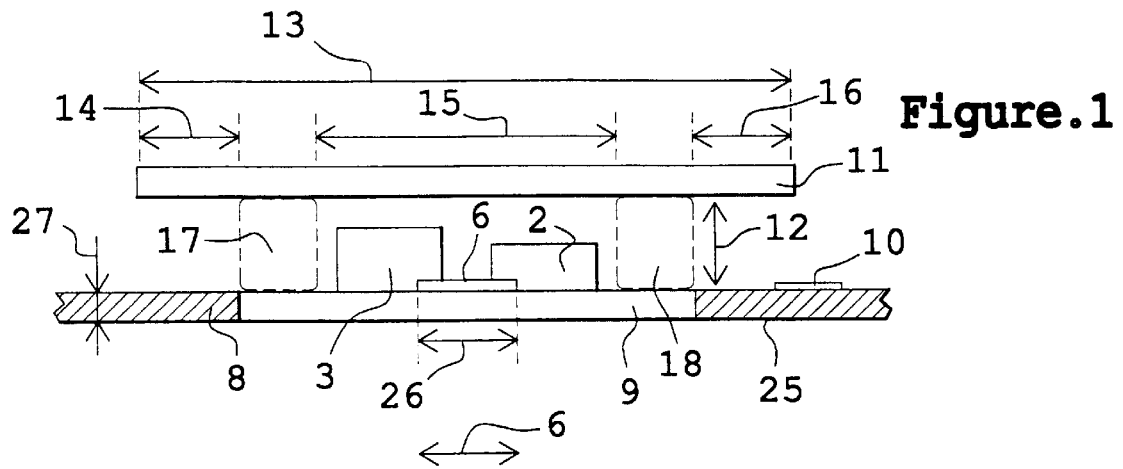
FIG. 1 and 2 are respectively a section view and a plan view showing an MMIC component forming a high-gain amplifier of the invention.
Figure 2:
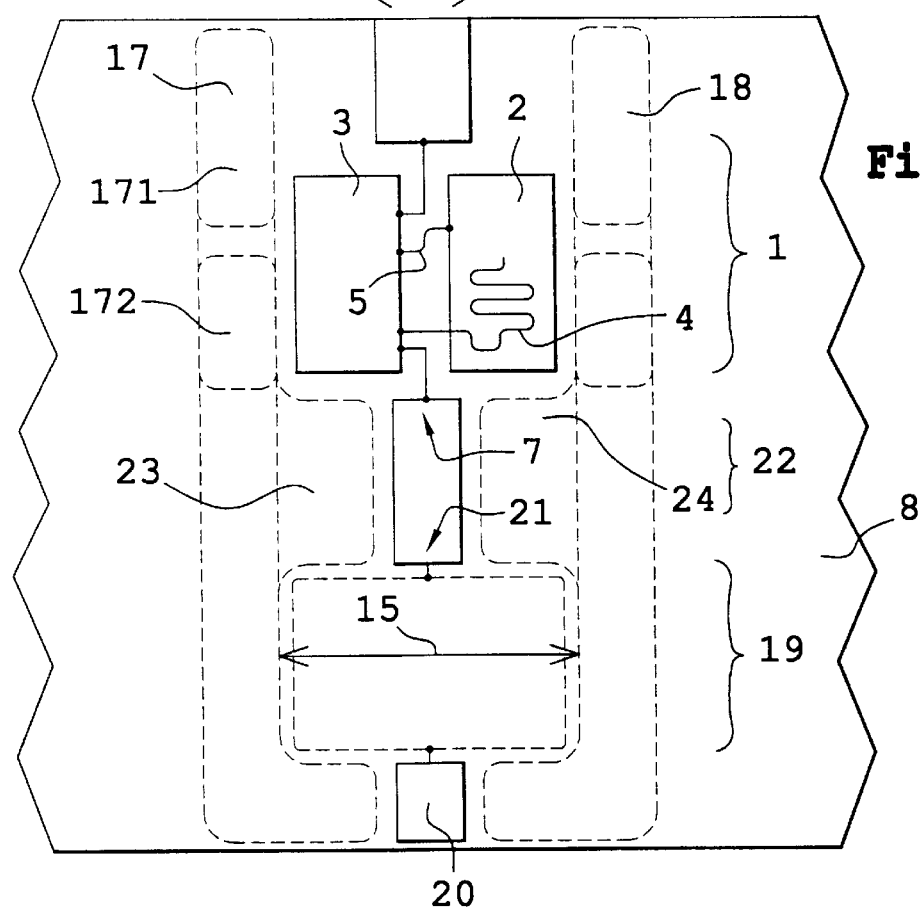

FIGS. 1 and 2 show a high-gain amplifier of the invention. In FIG. 2, the amplifier includes at least one amplification circuit 1. This circuit includes electronic components 2 and 3 in an integrated circuit. These components 2 and 3 are connected together via connections 4 and 5 whose geometrical shape and distribution are particularly well suited to the microwave nature of the amplification circuit. The connections are implemented in the form of wires in air and naturally not in contact with ground in the circuit. On a first side, the circuit 1 has a signal input 6, and, on a second side, opposite from the first side, it has a signal output 7. The signal enters via the input 6, it is processed by the integrated circuits 2 and 3, and it is output in the amplified state via the output 7.

FIG. 1 is a diagrammatic section view showing these elements. It shows that the circuits 2 and 3 are installed on a support. The support comprises an insulating plate 8. In a central recess, the plate 8 contains a metal baseplate 9. Metal plating 10 provided on the plate 8 makes it possible to transmit control signals to the integrated circuits 2 and 3, in particular electrical power and gain-control signals, so as to amplify the signals fed in via the connection 6. In any event, the control signals have frequencies considerably lower than the frequency of the high-frequency signal to be amplified. In practice, the signals are either DC signals (they are then constituted by the electrical power for the integrated circuit), or else they are at a low frequency, of not more than 100 MHz.

The circuit 1 is covered with a metal cover 11. The cover 11 is retained on the baseplate 9 by metal walls or pillars (not shown). In the state of the art, a space 12 situated between the baseplate 9 and the cover 11 is packed with absorbent materials, with the above-mentioned ensuing drawbacks.

The width 13 of the cover is wide enough for radio propagation modes of the signal as amplified and available at the output 7 to be able to propagate through the space between the plate 8 and the cover 11.

In the invention, to avoid such propagation, the width 13 is subdivided into a plurality of waveguides, namely three waveguides in this example: the waveguides 14, 15, and 16. As explained below, the thickness and width characteristics of the waveguides are such that they are not large enough to propagate any mode of the amplified signal available at the output 7. It is known that, to prevent a mode referred to as "TE01" from propagating in a waveguide, it is necessary merely for the width of the waveguide to be less than $\lambda/4$, where $\lambda$ is the wavelength of the propagated wave in the dielectric of the waveguide. In the presence of a plate provided with microstrip lines, the most permissive mode is the "LSM11" mode (longitudinal magnetic) whose characteristic dimensions are not $\lambda/4$: they are smaller and complex to compute. However, even for that mode, a computable cutoff frequency exists below which propagation is impossible. And if the LSM11 mode cannot propagate, no other, higher mode can propagate.

The idea of the invention is thus to know the characteristics of each of the waveguides 14 to 16. This is easy since the width 13 is known, and the number of subdivisions and the sizes of the sections that are to be implemented is known. To know the characteristics of the waveguides constituted in this way, the cutoff frequency of the LSM11 mode is computed. Such computation is complex but of known type. For example, it is available in the "Handbook of Microwave Integrated Circuits" by Reinmut K. Hoffmann, published by Artech House, in Norwood, United States of America. This computation is then used to determine a cutoff frequency. It is then determined whether the resulting frequency is greater than the upper limit of the high-frequency band for which the amplification circuit is designed. If the cutoff frequency is greater than the upper limit of the high-frequency band, then the envisaged subdivision of the waveguides is acceptable. Otherwise, the space 13 must be subdivided further with waveguides of smaller sections.

In the example shown in FIG. 1, which is a practical example, two bars, respectively 17 and 18, made entirely of metal, have thus been implemented. The material inside the bars 17 and 18 also offers the advantage of being stable: of not degassing. In one example, it is machined metal. It is also possible to use a ceramic with metal-plated holes. The bars 17 and 18 are disposed in contact with and between the baseplate 9 and the cover 11 so as to constitute separations between waveguides. A first auxiliary waveguide 14 is then formed by a metal wall which is adjacent to the MMIC component (not shown) on the left (FIG. 1), with the baseplate 9 below, the cover 11 above, and the bar 17 on the right. A second auxiliary waveguide 16 is formed symmetrically on the right in co-operation with the bar 18.

The third space 15 is an auxiliary waveguide containing air and whose metal walls are constituted by the cover 11, and by the walls of the bars 17 and 18. In any event, subdividing the space 13 into three in this way is quite sufficient to achieve the desired result.

FIG. 2 also shows a second amplification circuit 19 connected in cascade and under the same conditions as the circuit 1. The resulting overall amplification circuit has a common cover 11 which extends from the input 6 to an output 20 of the circuit 19. FIG. 2 shows the central waveguide 15 formed by the bars 17 and 18 placed at the edges of the integrated circuits 2 and 3.

In a particular use, for particular amplification reasons, the frequency of the signals has had to be doubled between the output 7 of the circuit 1 and an input 21 of the circuit 19. As a result the cutoff frequency constraints are tougher. Thus, to prevent the signals whose frequency has been doubled from propagating from the output 20 to the input 6, even via the waveguide 15 (of section that is too large for a double-frequency wave and that would allow it to pass), other bars, respectively 23 and 24, have been placed in a transition space 22 between the output 7 of the circuit 1 and the input 21 of the circuit 19. The transition space 22 includes the metal sections 17, 23, 24, and 18 as well as an empty air space or gap between the structures 23, 24 and the cover 11. By reducing the width of the gap 122, it is possible to overcome the consequences of the doubling of the frequency. At the gap 22, the auxiliary waveguide characteristics are thus modified: the waveguide 15 is itself made narrower there.

At the input 6 and at the output 20, the plate 8 co-operates with corresponding metal-plated tongues and metal-plating 25 underlying the plate 8, to form waveguides. The characteristic impedance of these waveguides depends on the width 26 of the tongues and on the thickness 27 of the plate. In one example, the characteristic impedance of these waveguides is 50 Ohms.

FIG. 4 shows a housing 30 and its lid 31, the housing containing an MMIC amplification component such as the component described with reference to FIGS. 1 and 2. In this component, it is possible to see essentially the cover 11, a side bar 17 and the control connection tabs inside the MMIC component. The tabs 10 are connected to the amplification circuit via connections 32. The connections 32 may go past the ends of the structures 17 (so that they do not come into contact therewith), or else they may pass between two longitudinal segments 171 and 172 of the structure 17 which is then subdivided into two portions. In one example, both segments 171 and 172 are of equal length. It is also possible to see the layer 25 of metal plating on the bottom of the plate 8. This layer also extends below and in contact with the baseplate 9.

Figure 5:
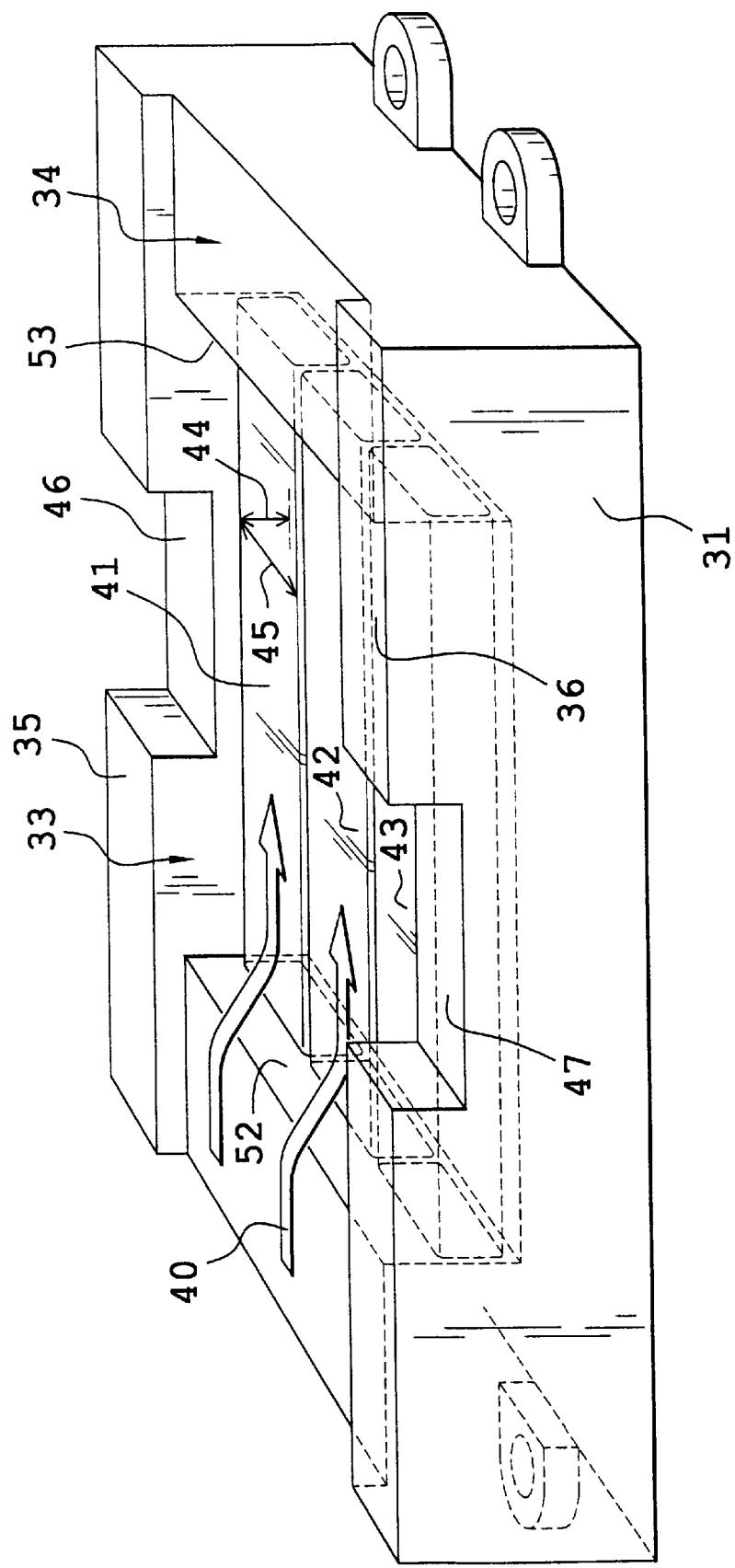

FIG. 5 shows the lid 31 on its own and upside down. The lid 31 is provided with a deep cavity 33 in which a channel 34 is provided. Thus, the lid 31 is provided with two side walls 35 and 36 situated on either side of the channel 34. In the example shown, the lid is made of solid metal. For example, it is cut from a block of silver-plated aluminum or of brass, by milling, or else it is made directly by casting.

As shown in FIG. 4, the deep cavity 33 serves to accommodate the volume taken up by the MMIC component 11 above the plate 8. The channel 34 serves to receive tracks 35 which lead from a front face 371 of the housing 30 to the input 6 of the MMIC component 11, and from the output 7 or 20 of the MMIC component 11 to a rear face 372 of the housing 30. The tracks 35 may be implemented in continuity with the tracks 6, 7, 21, and 20. When there are two MMIC components in the same housing, the housing has two deep cavities. If the MMIC component is a double component, as shown in FIGS. 1 and 2, only one deep cavity is provided. The tracks 35 are connected operationally in particular by soldered wires 39 to pins such as 38 of the coaxial type mounted on the faces 36 and 37.

At the output of the MMIC component, in the channel 34, in spite of the tracks 35 on the plate 8 being matched as perfectly as possible, the amplified wave radiates and propagates back towards the input along a path 40. In other words, the wave follows the channel 34, goes via the deep cavity 33 and tends to propagate along the channel to the input of the MMIC amplification component 11.

FIG. 5 shows that the propagation 40 is countered by the presence, at the bottom of the deep cavity 33, of waveguides 41 to 43 which subdivide the space situated in the deep cavity 33 between the lid 31 and the cover 11 (not shown in FIG. 5). Preferably, the waveguides 41 to 43 are made of resilient materials so as to ensure that the conductive faces of the waveguides 41 and 43 come into contact firstly with the bottom of the deep cavity 33 and secondly with the cover 11 when the lid 31 is put in place on the housing 30.

The height 44 and the width 45 of the waveguides 41 to 43 are determined as described above to achieve, in this example, a TE10 mode cutoff frequency that is greater than the upper limit of the working passband in the amplification application considered. The space above the cover is thus subdivided into a plurality of additional waveguides, each of which has characteristics lower than the cutoff.

In practice, the material used for the additional waveguides is simply seal material for electromagnetic shielding, usable for shielding the rabbets of electronic cabinet doors. It is very low cost and is quite suitable for the indicated use. The outside walls of the seal segments form the four faces of respective ones of the additional waveguides. The insides of the seals may be made merely of insulating foam, or of metal-filled foam, because such foam essentially constitutes the dielectric insides of the additional waveguides.

By extrapolation, it is possible to install only every other seal segment in the width direction. This reduces the quantity of seal required and the fitting time in an industrial process. In which case, certain additional waveguides are formed by the adjacent walls of the waveguides placed on either side, and these waveguides include air as the dielectric in place of the insulating foam. This configuration is shown in FIG. 6. In FIG. 6, the waveguides 60 and 61 include air as a dielectric, which means that, in this example, only three seals 41, 42, and 43 need to be used instead of five. It is also possible to place two seals in the positions 60 and 61 instead of the seals 41, 42, and 43. The segments 41–43 thus form air-filled waveguides.

The walls 35 and 36 are also provided with notches 46 and 47. The notch 47 shown in FIG. 4 is useful to pass the control connections 32 to the MMIC component 11. In addition, the walls 35 and 36 rest on either side of the notches on metal plating such as 48 implemented above the plate 8. The metal plating 48 is preferably connected to the conductive layer 25 of the plate 8 via metal-plated holes 49. The layer 25 is preferably connected to ground.

In one example, the height 50 of the notch 46 is about 1 mm, while the depth 51 of the channel 34 is about 2 mm. As a result, the housing 30 and the lid 31 co-operate with the plate 8 to form an assembly that is completely impermeable to the propagation of the electromagnetic waves produced by the MMIC component 11. The lid 31 is fixed to the housing 30 by lugs 52 provided with screw-receiving bores 53.

One of the characteristics of the invention is thus that the cover of the MMIC component 11 is made of metal instead of being made of an insulating ceramic material as it is in the state of the art. The conduction characteristics of the cover 11 are such as to constitute the waveguides inside and outside the MMIC amplification component.

It has been observed that, if the waveguides 41 to 43 are not brought into abutment against the input flank 52 and the output flank 53 of the deep cavity 33, the cutoff phenomenon is exactly the same. Reverse wave propagation is prevented. It is as if the waveguides 41 to 43 constitute preferred but blind passageways for the return waves. Naturally, if the frequency of the wave to be blocked increases, it is necessary merely to increase the number of waveguides 41 to 43, while reducing their size accordingly.

Figure 3:
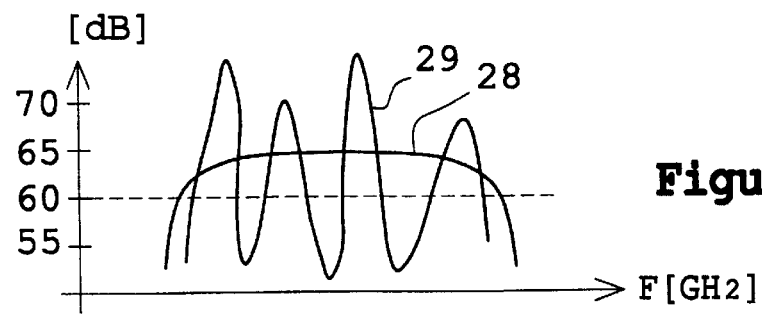
FIG. 3 is a graph showing the amplification gain obtained with the amplifier of the invention and with state-of-the-art amplifiers.

In an example for mean amplification of 60 dB, FIG. 3 shows an amplification curve 28 obtained with the amplifier of the invention, and a curve 29 obtained under the same conditions in the state of the art. If, by means of the control signals applied to the tabs 10, the gain were increased further, the unpredictable nature of the amplification 29 would show up to an even greater extent. The amplifier would then be unusable because it would amplify some spectrum components too strongly (it would be quasi-oscillatory), while it would completely damp other spectrum components. Conversely, in the invention, the gain is the same regardless of the value of the spectrum component.

What is claimed is:
1. A high-gain amplifier for amplifying electrical signals distributed in a high-frequency band, the amplifier comprising:

a support;

an amplification circuit mounted on the support, the amplification circuit comprising an input on a first side and an output on a second side opposite from said first side;

a cover disposed over the amplification circuit; and subdivision means for subdividing into a plurality of auxiliary waveguides a space situated between the cover and the support, the characteristics of the auxiliary waveguides being unsuitable for enabling a signal whose frequency is situated in the high-frequency band of the amplifier to propagate between the output and the input of the amplification circuit, wherein the subdivision means comprises a bar having a conductive outside surface, aligned in a direction going from the input to the output of the amplification circuit, and disposed between the support and the cover, on edges of integrated circuits forming the amplification circuit.

2. An amplifier according to claim 1, wherein the bar comprises two aligned segments.

3. An amplifier according to claim 1, wherein the amplification circuit includes a transition space having a low cutoff frequency that is higher than he high-frequency band, and wherein, in the transition space, the characteristics of the auxiliary waveguides are modified.

4. A high-gain amplifier for amplifying electrical signals distributed in a high-frequency band, the amplifier comprising:

a support; an amplification circuit mounted on the support, the amplification circuit comprising an input on a first side and an output on a second side opposite from said first side;

a cover disposed over the amplification circuit;

subdivision means for subdividing into a plurality of auxiliary waveguides a space situated between the cover and the support, wherein the characteristics of the auxiliary waveguides are unsuitable for enabling a signal whose frequency is situated in the high-frequency band of the amplifier to propagate between the output and the input of the amplification circuit; and a housing including a lid enclosing said amplification circuit, support and cover, wherein a space between the lid and the cover of the amplification circuit is subdivided by a plurality of additional waveguides whose characteristics are unsuitable for enabling a signal whose frequency is situated in the high-frequency band of the amplifier to propagate.

5. An amplifier according to claim 4, wherein the space between the lid and the cover is subdivided by resilient bars whose outside surfaces are conductive.

6. An amplifier according to claim 4, wherein the cover is provided with a deep cavity provided in a channel, the deep cavity receiving the additional waveguides, the channel serving to connect the input and the output of the amplification circuit respectively to an input and to an output of the housing, and to isolate them respectively therefrom.

7. An amplifier according to claim 4, wherein the dimensions of the auxiliary or additional waveguides are insufficient to allow the LSM11 or the TE10 mode to propagate.

8. An amplifier according to claim 1, wherein the cover is made of metal.

* * * * *